(12) United States Patent
Skinner et al.

(10) Patent No.: US 6,812,147 B2
(45) Date of Patent: Nov. 2, 2004

(54) GCIB PROCESSING TO IMPROVE INTERCONNECTION VIAS AND IMPROVED INTERCONNECTION VIA

(75) Inventors: Wesley J. Skinner, Andover, MA (US); John J. Hautala, Beverly, MA (US)

(73) Assignee: Epion Corporation, Billerica, MA (US)

( * ) Notice: Subject to any disclaimer, the term of this patent is extended or adjusted under 35 U.S.C. 154(b) by 69 days.

(21) Appl. No.: 10/269,605

(22) Filed: Oct. 11, 2002

(65) Prior Publication Data
US 2003/0073314 A1 Apr. 17, 2003

Related U.S. Application Data

(60) Provisional application No. 60/328,632, filed on Oct. 11, 2001.

(51) Int. Cl.[7] ....................... H01L 21/302; H01L 21/461
(52) U.S. Cl. ........................................ 438/690; 438/706
(58) Field of Search ................................. 438/689, 690, 438/706

(56) References Cited

U.S. PATENT DOCUMENTS

| 5,098,860 A | 3/1992 | Chakravorty et al. |
|---|---|---|
| 5,674,787 A | 10/1997 | Zhao et al. |
| 5,683,547 A | 11/1997 | Azuma et al. |
| 5,814,194 A * | 9/1998 | Deguchi et al. ......... 204/192.1 |
| 5,985,762 A | 11/1999 | Geffken et al. |

OTHER PUBLICATIONS

Matsuo, Jiro et al. "Nanofabrication Technology by Gas Cluster Ion Beams", J. Vac. Sci. Technol. B 14(6), Nov./Dec. 1996, pp. 3951–3954.*

* cited by examiner

Primary Examiner—Evan Pert
Assistant Examiner—Scott B. Geyer
(74) Attorney, Agent, or Firm—Perkins Smith & Cohen LLP; Jerry Cohen; Jacob N. Erlich

(57) ABSTRACT

Reactive gas cluster ion beam processing using gas cluster ions comprising a mixture of gases cleans and/or etches the bottoms of electrical interconnect vias and/or trenches in integrated circuits to produce interconnect structures with lower contact resistances and better reliability than was previously achieved with conventional processes. In one embodiment, an electrical interconnect via structure uses a dielectric or high resistivity diffusion barrier material.

31 Claims, 14 Drawing Sheets ered in the art. For purposes of this discussion, gas clusters are nano-sized aggregates of materials that are gaseous under conditions of standard temperature and pressure. Such clusters typically consist of aggregates of from a few to several thousand molecules loosely bound to form the cluster. The clusters can be ionized by electron bombardment or other means, permitting them to be formed into directed beams of known and controllable energy. The larger sized clusters are often the most useful because of their ability to carry substantial energy per cluster ion, while yet having only modest energy per molecule. The clusters disintegrate on impact, with each individual molecule carrying only a small fraction of the total cluster energy. Consequently the impact effects of large clusters are substantial, but are limited to a very shallow surface region. This makes ion clusters effective for a variety of surface modification processes, without the tendency to produce deeper subsurface damage characteristic of monomer ion beam processing.

GCIB PROCESSING TO IMPROVE INTERCONNECTION VIAS AND IMPROVED INTERCONNECTION VIA

RELATED APPLICATIONS

The present application is a non-provisional application of U.S. Provisional Patent Application, Ser. No. 60/328,632, filed Oct. 11, 2001 and hereby claims priority under 35, U.S.C. 120 of that Provisional Application.

BACKGROUND OF THE INVENTION

This invention relates generally to applying gas cluster ion beams (GCIB) to improve the quality of electrical interconnections in integrated circuitry, and, more particularly to improving electrical interconnections by etching and/or cleaning the bottoms of interconnect vias between integrated circuit interconnect layers in circuits employing the dual damascene process, or the like, prior to forming the interconnecting via plug.

The use of a gas cluster ion beam for etching or cleaning planar material surfaces is known (see for example, U.S. Pat. No. 5,814,194, Deguchi et al.) in the art. For purposes of this discussion, gas clusters are nano-sized aggregates of materials that are gaseous under conditions of standard temperature and pressure. Such clusters typically consist of aggregates of from a few to several thousand molecules loosely bound to form the cluster. The clusters can be ionized by electron bombardment or other means, permitting them to be formed into directed beams of known and controllable energy. The larger sized clusters are often the most useful because of their ability to carry substantial energy per cluster ion, while yet having only modest energy per molecule. The clusters disintegrate on impact, with each individual molecule carrying only a small fraction of the total cluster energy. Consequently the impact effects of large clusters are substantial, but are limited to a very shallow surface region. This makes ion clusters effective for a variety of surface modification processes, without the tendency to produce deeper subsurface damage characteristic of monomer ion beam processing.

Means for creation of and acceleration of such GCIBs are described in the reference (U.S. Pat. No. 5,814,194) previously cited. Presently available ion cluster sources produce clusters ions having a wide distribution of sizes, n (where n=the number of molecules in each cluster—in the case of monatomic gases like argon, an atom of the monatomic gas will be referred to as a molecule and an ionized atom of such a monatomic gas will be referred to as a molecular ion—or simply a monomer ion—throughout this discussion).

In the semiconductor industry, increasing circuit density drives progress toward smaller and smaller dimensions and larger numbers of transistors placed in an individual device. The challenges to interconnect these transistors becomes increasingly difficult. Some of the problems faced with denser interconnections are increased heat dissipation, greater power consumption, and longer signal delays resulting from higher resistance in the interconnects. Moving to the use of lower resistivity metals for the interconnections helps to alleviate these problems, and the dual damascene Cu interconnect scheme is becoming favored. However, in common modern interconnect structures a diffusion barrier material must be employed to encapsulate the metal conductor to prevent diffusion of the conductor metal atoms so as to avoid undesired contamination of the semiconductor materials. Typical barrier materials used are thin films of materials such as Ta, TiN, TaN, etc., which have significantly higher electrical resistivities than the Al or Cu used as the interconnect metal. Dielectric materials like SiC and SiN also make effective diffusion barriers and have advantages but have not so far found wide acceptance because they have much higher electrical resistance and do not provide low resistance electrical continuity at the bottoms of electrical interconnect vias. Usually, cylindrical vias form the connections between interconnect metal layers, and barrier material films are used inside the vias. The barrier materials must first be deposited in such a way as to form a continuous layer on the sidewalls of the via. Typically this results in an additional amount also deposited at the bottom of the contact (bottom or base of the via). This film at the bottom of the contact is unnecessary as a diffusion barrier since the adjacent material is the interconnect metal, and unfortunately contributes an increased resistivity obstruction in the electrical current path. The interface resistance between the interconnect metal and the barrier material also exacerbates this problem. The Semiconductor Industry Association's *International Technology Roadmap for Semiconductors* (ITRS 2000) projects that barrier/cladding thickness must be decreased to from 13 nm to 10 nm by 2005 and to 0 nm by 2008 in order to meet industry goals.

Another significant source of high contact resistance is residue of materials from previous process steps in the manufacturing of the interconnect structures that tend to be trapped or otherwise remain in the bottom of the contact via structures. These residues generally consist of high resistivity materials such as organic compounds from photo-resists, and by-products of etching of other layers in the film stack. The removal of this contamination layer at the bottom of a contact structure is another significant means for improvement in IC performance.

In modern interconnect technology, via holes are etched through the inter-metal dielectric layer between interconnect layers, using a mask. After etching, the bottom of the vias have residual byproducts (such as for example, SiN and CuO in a dual damascene process) that can adversely affect via interconnect resistance. It is problematic to effectively get etchants to the bottoms of the interconnect vias. Plasma etching or cleaning technologies operate in the range of pressures greater than $10^{-3}$ Torr. At such pressures the mean free path of the ion is short (less than about 5 cm for Ar at $10^{-3}$ Torr) and make many collisions that result in poor etching directionality. Thus the reactive ions tend to attack the interconnect via sidewalls and can undesirably reduce the sidewall barrier material thickness. This increases the risk of a breach in the barrier. It is also very difficult to get reacted material evacuated from the bottom of the contact. After the cleaning step, a barrier material is deposited and then the via is filled with the plug material (for Al interconnects) or, for Cu interconnects, a seed Cu layer is deposited and then the via is then filled with a Cu plug. Any residues can dramatically degrade the interconnect via characteristics.

GCIBs having sufficient flux density to clean or etch planar surfaces or surfaces having modest deviations from planarity are readily generated with existing technology. Similarly, more conventional monomer ion beams capable of etching or milling or cleaning planar or near-planar surfaces are also readily generated. When such beams are used to clean or etch surfaces, the cleaning or etching generally results from a sputtering process or in the case where a reactive ion species is employed, reactions of the ions with the surface can work in combination with a sputtering process. Because of the large aspect ratios of interconnect vias it has not been practical to clean or etch the bottoms of interconnect vias without undesirable effects on the sidewalls of the vias. Directed beams of conventional monomer ions are not readily produced with high flux densities necessary for practical cleaning or etching rates while simultaneously having a high degree of directionality (low beam emittance and low beam divergence). Energetic monomer ions striking a surface at a grazing angle tend to have a higher sputtering rate much higher than they do when they strike a surface at normal or near-normal incidence. Accordingly, when such ions are directed down an interconnect via hole, sputtering of the sidewalls tends to proceed at a higher rate than sputtering of the bottom.

It is therefore an object of this invention to provide a method to effectively and efficiently clean the bottoms of interconnect vias without significantly degrading the integrity of the barrier material film on the interconnect via sidewalls.

It is also an object of this invention to provide a method to effectively and efficiently clean or etch the bottoms of interconnect vias without significantly etching the sidewalls of the interconnect vias.

It is a further object of this invention to provide a method to etch away the barrier material film and any contaminants at the bottoms of interconnect vias without significantly degrading the integrity of the barrier material film on the interconnect via sidewalls in order to make lower resistance contacts between interconnect layers.

It is a still further object of this invention to provide an electrical interconnect via for integrated circuits that uses dielectric or high resistivity diffusion barrier materials.

SUMMARY OF THE INVENTION

The objects set forth above as well as further and other objects and advantages of the present invention are achieved by the embodiments of the invention described hereinbelow.

One embodiment of the present invention provides a method for processing a recess, such as a trench or via, which extends into a substrate to a base or bottom, comprising the step of directing a gas cluster ion beam through the recess on to the base or bottom. In one refinement, the recess is coated with a barrier material on a sidewall and the base or bottom of the recess, and further wherein the step of directing is used for etching the barrier material from the base or bottom of the recess without substantially etching the barrier material from the sidewall of the recess. Further, the recess may be an opening in an inter-metal dielectric material, and further wherein the barrier material is a highly resistive, diffusion barrier layer.

In another refinement, the step of directing includes moving the gas cluster ion beam with respect to the substrate while maintaining the substrate substantially normal to the gas cluster ion beam.

In yet another refinement, the step of directing is used for removing residue material from the base or bottom of the recess after formation of the recess in the substrate.

In still another refinement, the recess extends into the substrate in one or more directions to the base or bottom, wherein the step of directing is performed approximately parallel to said one or more directions.

In still another refinement, the step of directing is performed in an atmospheric pressure of less than $10^{-4}$ Torr.

In still another refinement, the gas cluster ion beam clusters may include an inert gas and a reactive gas. The reactive gas may include or a halogen or halogen-bearing gas, and the mixture may include at least one of hydrogen or oxygen.

In another embodiment, the present invention provides a substrate having a recess such as a trench or via, extending into the substrate, and includes the recess having a base or bottom processed by a step of directing a gas cluster ion beam through the recess on to the base or bottom. In a refinement, the recess has at least one sidewall and is first coated with a barrier material on the sidewall and the base or bottom, wherein the step of directing is used for etching the barrier material from the base or bottom of the recess without substantially etching barrier material from the sidewall of the recess. In yet a further refinement, the recess is an opening in an inter-metal dielectric material, wherein the barrier material is a highly resistive, diffusion barrier layer. In still a further refinement, the substrate further includes a conductive interconnect located within the recess and surrounded along at least one sidewall by the highly resistive, diffusion barrier layer, wherein the conductive interconnect includes a relatively low resistance connection at the base or bottom of the recess In another refinement, the substrate includes a surface proximal to the recess and on which the barrier material is also coated, wherein the step of directing is used for thinning of the barrier material on the proximal surface.

In yet another refinement, the step of directing includes forming the gas cluster ion beam from an inert gas and a reactive gas to reduce re-deposition of etched material.

In another embodiment, a method for removing diffusion barrier layer material from a bottom of a trench or via structure during fabrication of an integrated circuit, includes:

providing an integrated circuit substrate for forming an integrated circuit, the substrate containing at least one trench or via structure at a surface of the substrate, the at least one trench or via structure having a bottom comprising diffusion barrier layer material and at least one sidewall comprising a diffusion barrier layer material;

forming an accelerated and directed gas cluster ion beam in a reduced pressure chamber, the gas cluster ion beam having a beam path;

disposing the surface of the substrate in the reduced pressure chamber and in the gas cluster ion beam path; and irradiating the bottom of the at least one trench or via structure with the gas cluster ion beam to remove diffusion barrier layer material from the bottom of the at least one trench or via structure.

In a refinement, the diffusion barrier layer material comprises at least one of the group (Ta, TaN, TiSiNx, SiC, and SiN).

In still another embodiment, an electrical interconnect via in an inter-metal dielectric substrate includes a sidewall surrounded by a highly resistive, diffusion barrier layer, and a base or bottom forming a relatively low resistance connection.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
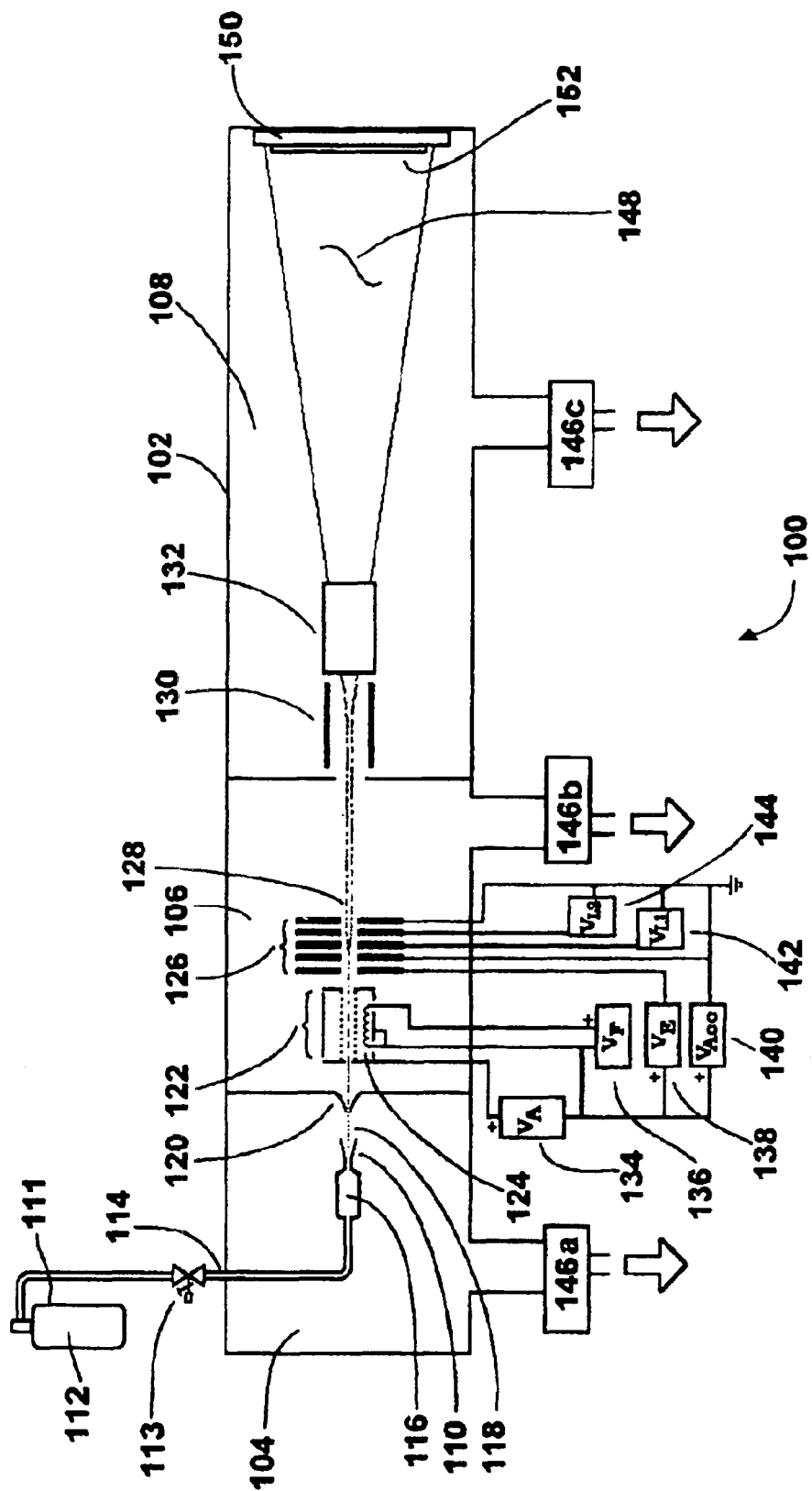
FIG. 1 is a schematic showing the basic elements of a prior art GCIB processing apparatus that uses an electrostatically scanned beam.

FIG. 1 shows a schematic of the basic elements of a typical configuration for a GCIB processor 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not necessarily limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB.

Filament power supply 136 provides voltage $V_F$ to heat the ionizer filament 124. Anode power supply 134 provides voltage $V_A$ to accelerate thermoelectrons emitted from filament 124 to cause them to irradiate the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{Acc}$ to bias a high voltage electrode with respect to the ionizer 122 so as to result in a total GCIB acceleration energy equal to $V_{Acc}$ electron volts (eV). One or more lens power supplies (142 and 144 shown for example) may be provided to bias high voltage electrodes with potentials ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
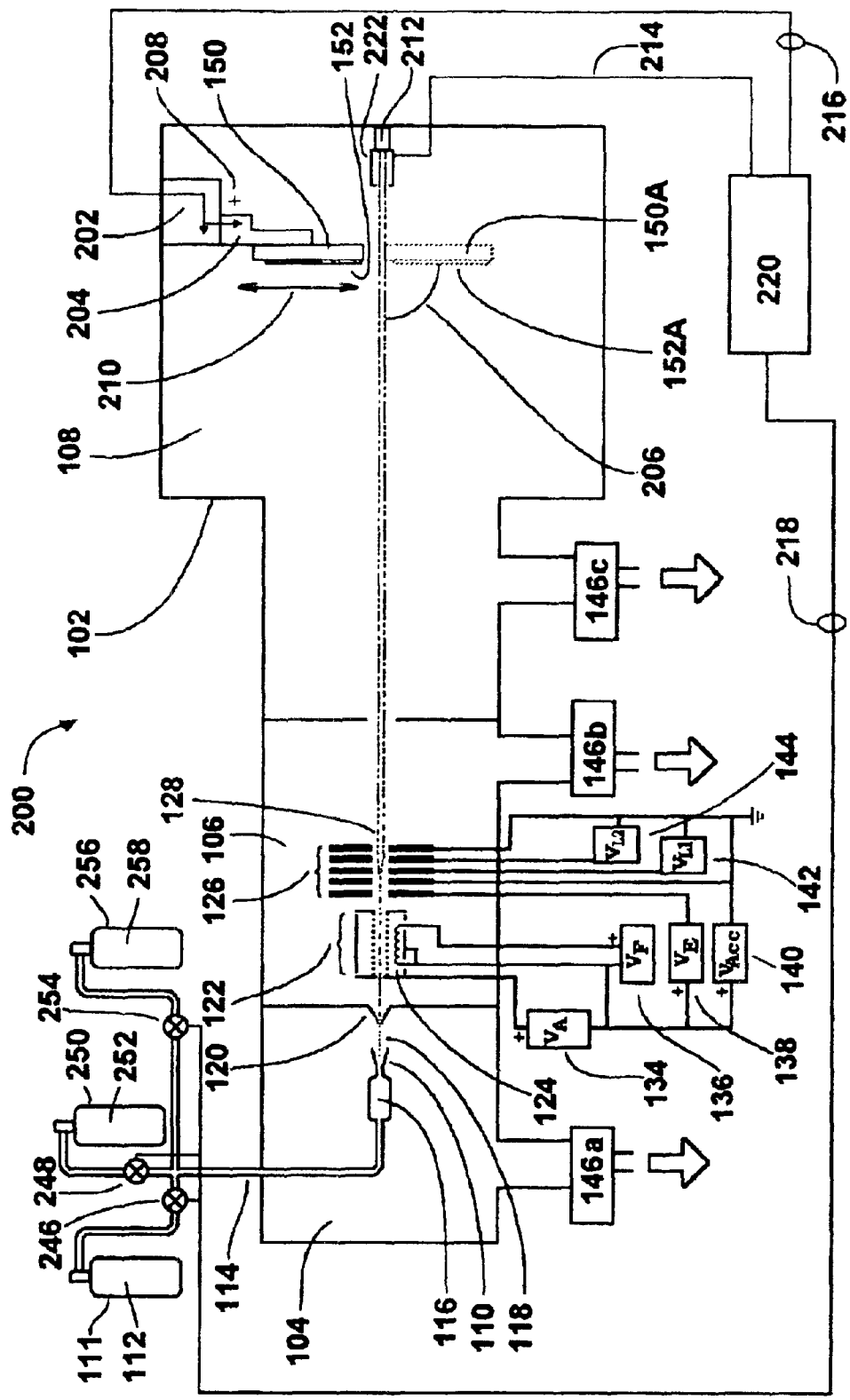
FIG. 2 is a schematic showing the basic elements of a GCIB processing apparatus of the present invention that uses mechanical scanning of a workpiece to distribute the effect of a GCIB over a surface of a workpiece.

FIG. 2 shows a schematic of the basic elements of an improved configuration for a mechanically scanning GCIB processor 200, which uses a mechanical scanning technique to scan the workpiece 152 relative to the GCIB. The workpiece 152 is a semiconductor wafer having on its surface one or more interconnection vias with axes substantially perpendicular to the surface. Such vias may also be other than perpendicular to the surface. GCIB formation is similar to as shown in FIG. 1, but in mechanically scanning GCIB processor 200 of FIG. 2, the GCIB 128 is stationary (not scanned) and the workpiece 152 is mechanically scanned through the GCIB 128 to distribute the effects of the GCIB 128 over a surface of the workpiece 152. Also, the single source gas supply of FIG. 1 is supplemented by additional condensable source gases 252 and 258, stored in a second and third gas storage cylinders 250 and 256 respectively. Three controllable valves, 246, 248, and 254, control flow of condensable source gases 112, 252, and 258 respectively. With suitable controls, valves 246, 248, and 254 can select any of source gases 112, 252, or 258 or can deliver a mixture of two or more of gases 112, 252, and 258, through gas feed tube 114 to stagnation chamber 116. Valves 246, 248, and 254 are preferably electronically controllable mass flow control valves with complete shut-off capability.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece 152 at an angle with respect to the axis of the GCIB 128 so that the GCIB 128 has an angle of beam incidence 206 with respect to the workpiece 152 surface, and X-scan motion 208 and Y-scan motion 210 maintain that angle of beam incidence to the workpiece 152 surface. The angle of beam incidence 206 may be 90 degrees or some other angle. During Y-scanning, the workpiece 152 held by workpiece holder 150 moves from the position shown to the alternate position "A", indicated by the designators 152A and 150A respectively. Notice that in moving between the two positions, the workpiece 152 is scanned through the GCIB 128 and in both extreme positions, is moved completely out of the path of the GCIB 128 (overscanned). Though not shown explicitly in FIG. 2, similar scanning and over-scan is performed in the orthogonal X-scan motion 208 direction (in and out of the plane of the paper).

A beam current sensor 222 is disposed beyond the workpiece holder 150 in the path of the GCIB 128 so as to intercept a sample of the GCIB 128 when the workpiece holder 150 is scanned out of the path of the GCIB 128. The beam current sensor 222 is preferably a faraday cup or the like and is affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. The apparatus may also include one or more, manual or automated, Z-axis controllers for accommodating angles of incidence of the beam on the substrate of other than ninety degrees.

Controller 220 receives the sampled beam current collected by the beam current sensor 222 by way of lead 214 and thereby monitors the GCIB and controls the GCIB dose received by the workpiece 152 by removing the workpiece 152 from the GCIB 128 when a predetermined desired dose has been delivered. Controller 220 also connects to valves 246, 248, and 254 through electrical cable 218 and controls valves 246, 248, and 254 to select any source gases 112, 252, or 258, or to select two or more gases in a mixture having controllable ratios of each constituent gas. Controller 220 also sets the flow rate of the selected source gas or the mixture of gases through the gas feed tube 114 to the stagnation chamber 116 for generating a gas jet 118 having a known and controllable constitution. Accordingly, a GCIB 128 having been formed from a source gas having a known and controllable constitution, which may be a single gas or a mixture of two or more gases can be generated. Controller 220 may be a portion of a general system controller that controls other functions and operation of the mechanically scanning GCIB processor 200. It is recognized that additional gas cylinders having additional gases controlled by additional valves could be provided to increase the mixture possibilities for the GCIB source gas constitution. It is also recognized that any single gas cylinder, cylinder 111 for example, could be filled with a source gas mixture in a premixed ratio of two or more source gases to provide a source gas mixture using a single gas cylinder and valve.

Figure 3:
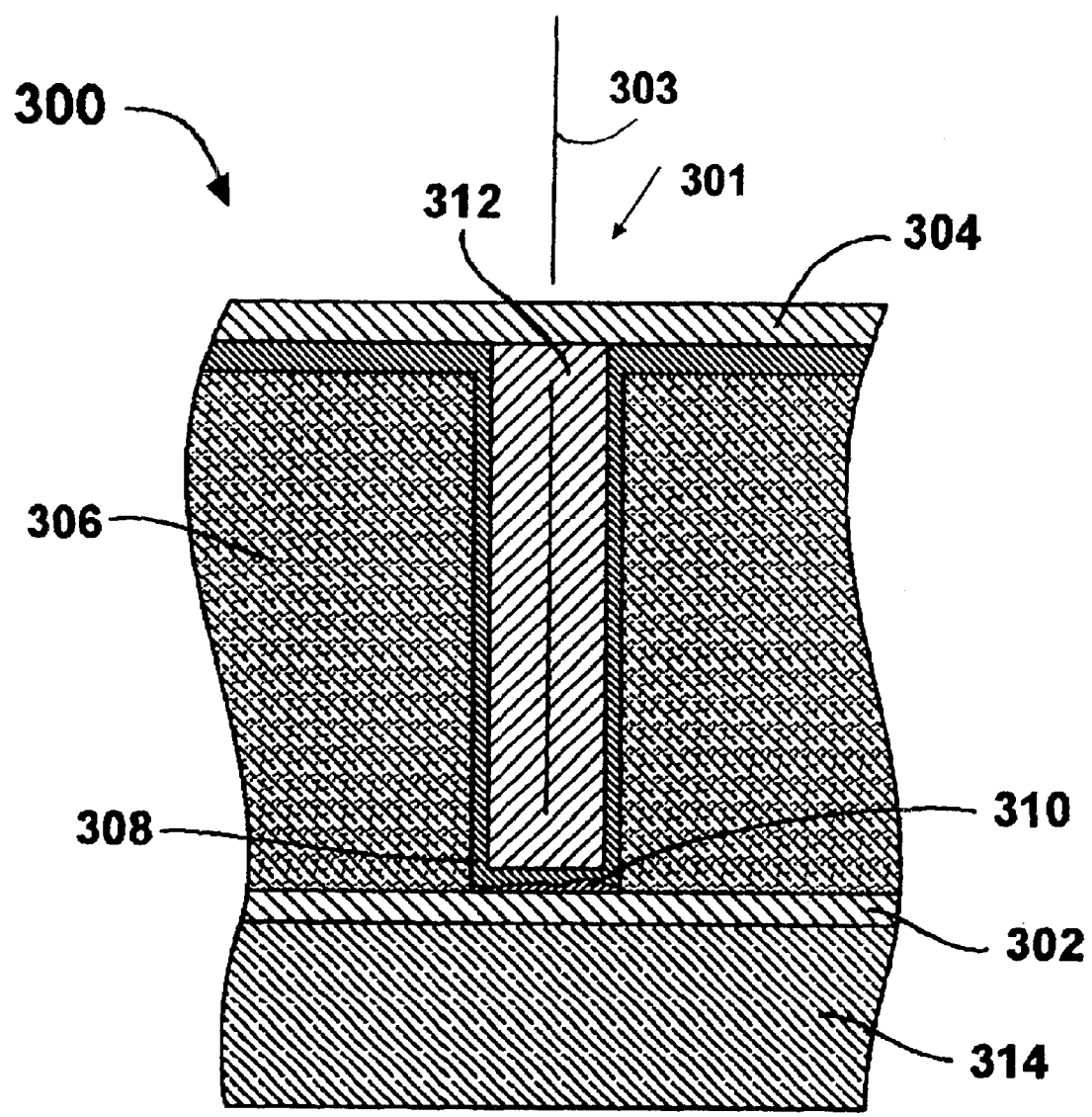
FIG. 3 is a cross section of a prior art electrical interconnect via between two metal interconnection layers of an integrated circuit.

FIG. 3 shows a cross section of an electrical interconnect via structure 300 formed in a recess 301 in a substrate 306. Via structure 300 has been fabricated in accordance with the prior art. Recess 301 is typically characterized by a central axis 303 which defines a single direction along which recess 301 extends into substrate 306. As shown, via structure 300 also represents a cross section of a trench-like via, and axis 303 represents an imaginary median surface for such trench-like via, which median surface extends through the surface of FIG. 3. In the instance of a straight trench, the imaginary median surface would be planar.

Metal interconnect layers 302 and 304 are two of what may eventually be several interconnection layers on an integrated circuit. Interconnect via 300 between the two metal interconnect layers 302 and 304, which are separated by interlayer dielectric substrate 306, is lined with a barrier material 308 and filled with a metal plug 312. Barrier material 308 separates the metal plug 312 from the lower metal interconnect layer 302, increasing the interlayer contact resistance, which is undesirable. Residue material 310 from previous processing stages is also present at the base or bottom of the electrical interconnect via between the metal plug 312 and the lower metal interconnect layer 302, which increases the interlayer contact resistance and decreases the long term stability and therefor the reliability of the interlevel connection, which is also undesirable.

By applying gas cluster ion beam technology according to the present invention, a method is provided for both cleaning residue from the base or bottom of the interconnect via prior to barrier deposition and also for removing barrier material (such as Ta, TaN, TiSiNx, etc.) from the bottom of the interconnect via, thereby reducing the contact resistance of the interconnect.

Sidewall etching/sputtering of the interconnect via or barrier material present on the sidewall is greatly minimized by the use of a gas cluster ion beam applied at approximately normal incidence to the surface of the integrated circuit. This orientation causes the ion beam to be approximately parallel to the axis of any typical recess in the substrate surface, such as the axis of a cylindrical interconnect via, or the median surface of a trench-like via. It is preferable that the GCIB have as low a divergence and emittance as is practical consistent with adequate beam flux density to provide practical processing speed. It is recognized that such practical GCIBs may have deviations on the order of a few degrees. Such gas cluster ions as may impact sidewalls, because of deviation of beam elements from parallelism to the via axis, have a very low sputter yield compared to those that strike surfaces at approximately normal incidence. This sputtering characteristic is notably different from that which occurs when conventional monomer ions are employed. Monomer ions have much higher sputter yields at low angles of incidence than at near-normal incidence and this and contributes to the destruction of the sidewalls. GCIB etching is shown to be effective in selectively removing the material at the bottom of an interconnection via or trench.

Although GCIBs composed of inert gases such as argon have been employed very successfully in the prior art to sputter surfaces for cleaning or etching, in order to clean or etch the bottom of an interconnect via, it is preferable to employ a GCIB comprising gas cluster ions comprising a mixture of an inert gas and a reactive gas such as fluorine (F), $SF_6$, $CF_4$, etc. in order to volatize the material at the bottom of the via. When inert gas clusters alone are employed in the GCIB processing, the sputtered material from the bottom of the via structure tends to re-deposit on the sidewalls of the via and may narrow the via impeding further processing and otherwise undesirably affecting the via structure. Adding fluorine to the GCIB clusters, results in reduced re-depositing of sputtered material on the sidewalls of the via, enabling successful processing. In addition, oxygen or hydrogen gas may be added to the clusters to minimize the formation of C-F polymers when carbon material may be present in residues in the via bottoms or when a gas cluster ion beam constituent is carbon, for example when $CF_4$ is used as a fluorine bearing reactive gas. By reducing polymer formation, the tendency to redeposit sputtered material from the bottoms of the vias on the sidewalls is also reduced.

In a dual damascene interconnect structure, the removal of barrier material will occur on all surfaces near-normal to the GCIB incidence. This also provides the advantage of thinning the barrier on top of the inter-metal dielectric (substrate surface), which is difficult to thin by CMP.

In one embodiment, the invention provides a method for processing a recess such as a trench or via which extends into a substrate to a base or bottom, including a step of directing a gas cluster ion beam through the recess directly on to the base or bottom. In a first application of this invention, GCIB processing is used to remove residues from the base or bottom of a recess, such as a via or trench opening in the inter-metal dielectric prior to forming the barrier material layer. This results in a residue-free contact between barrier material and the lower metal interconnect layer of the connection. The improvement is reduction of the contributions to contact resistance and poor reliability that result from the presence of such residues.

In a second application of this invention, GCIB processing is employed after barrier material layer formation to completely remove all barrier material and any residues from the bottom of a recess, such as an interconnect via or trench, prior to forming the metal plug for the recess. This results in both a residue-free and barrier-material-free contact between the plug metal and the lower interconnect metal layer. The improvement is reduction of the contributions to contact resistance and poor reliability that result from the presence of such residues. This enables the use of dielectric or high resistivity barrier materials in electrical interconnect vias or trenches (like SiC or SiN, for example) since the barrier material and any residues are both completely removed from the bottoms of the vias or trenches by the process of the invention.

In the second application, when all the barrier material at the base or bottom of the via is removed before filling the via or trench with plug metal, electromigration problems for the interconnect structure are reduced because a Cu—Cu or Al—Al connection for interconnect provides a constant source of Cu or Al atoms throughout the interconnect structure and minimizes void formation.

In another embodiment of this invention, a substrate includes a recess, such as an electrical via or trench structure, which recess is processed by directing a GCIB 128 onto the base or bottom of the recess. The recess may include a dielectric or high resistivity diffusion barrier material, such as SiN or SiC, which is located only on sidewalls and not on the base or bottom of the recess.

There are several advantages for GCIB cleaning/etching of via bottoms compared to the more conventional plasma etching or reactive ion etching technologies: 1) GCIB processing is readily performed at less that $10^{-4}$ Torr. This is an order of magnitude lower process pressure and the mean free path of the reactive ions are correspondingly longer and can maintain a degree of beam collimation; 2) Gas cluster beams are formed from a nozzle source and typically employs beam optics and acceleration to form a substantially collimated beam of gas cluster ions; 3) Gas cluster ions may be directed to impact on a surface at a near-normal angle (parallel to the axis of a recess); 4) Gas cluster ions may be formed with a mixture of gas species that will react to the barrier material or residue (such as fluorinated molecules F, $SF_6$, $CF_4$, etc.); 5) Gas cluster ions may contain a binding gas such as $O_2$ or $H_2$ gas that will react with free radical molecules (fluorinated) to help prevent polymerization of the fluorinated species.; 6) An additional GCIB cleaning process step may be used to remove surface oxides and contaminates; 7) A GCIB processing chamber may be readily connected to a deposition cluster tool to minimize re-oxidation before subsequent seed deposition or plug fill steps; and 8) In the case of a copper damascene process, the surface of the lower copper metal interconnect layer may be exposed and conditioned with GCIB to optimize the seed layer for subsequent Cu grain growth.

Figure 4:
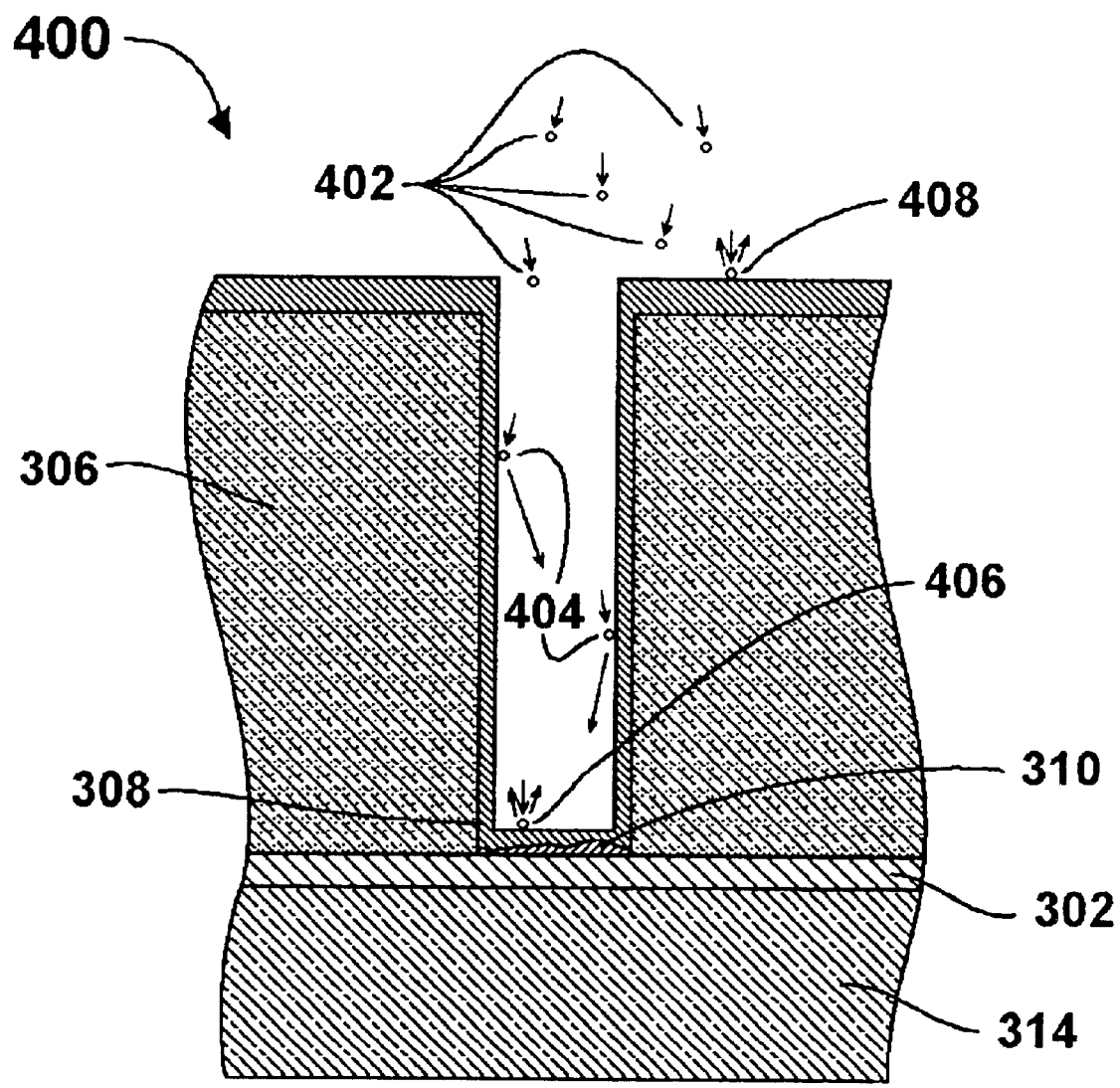
FIG. 4 is a cross section of a prior art electrical interconnect via, illustrating processing of barrier material by conventional monomer ion bombardment.

FIG. 4 shows a cross section of a prior art electrical interconnect via structure 400, during a stage of fabrication of an integrated circuit earlier than the stage shown in FIG. 3. The interconnect via structure has been etched in the interlayer dielectric 306 and a barrier material 308 has been formed on the interlayer dielectric 306. Conventional prior art monomer ion bombardment to clean/etch the via bottom is illustrated. Incident ions 402 have a range of directions deviating slightly from normal to the bottom of the via structure and may be provided by a directed beam or a plasma etch or reactive ion etch source. Ions 404 striking the sidewalls of the via tend to sputter the sidewalls more effectively than ion 406 striking the bottom of the via structure because conventional monomer ions sputter least efficiently when their angle of incidence is near-normal to the surface they strike. Accordingly, conventional monomer ion processing of via structures is not efficient for etching or cleaning the barrier material 308 at the bottom of via structure 400. Ion 408 striking the upper surface of the barrier material 308 cleans or etches, but much less so than the sidewalls of the via structure.

Figure 5:
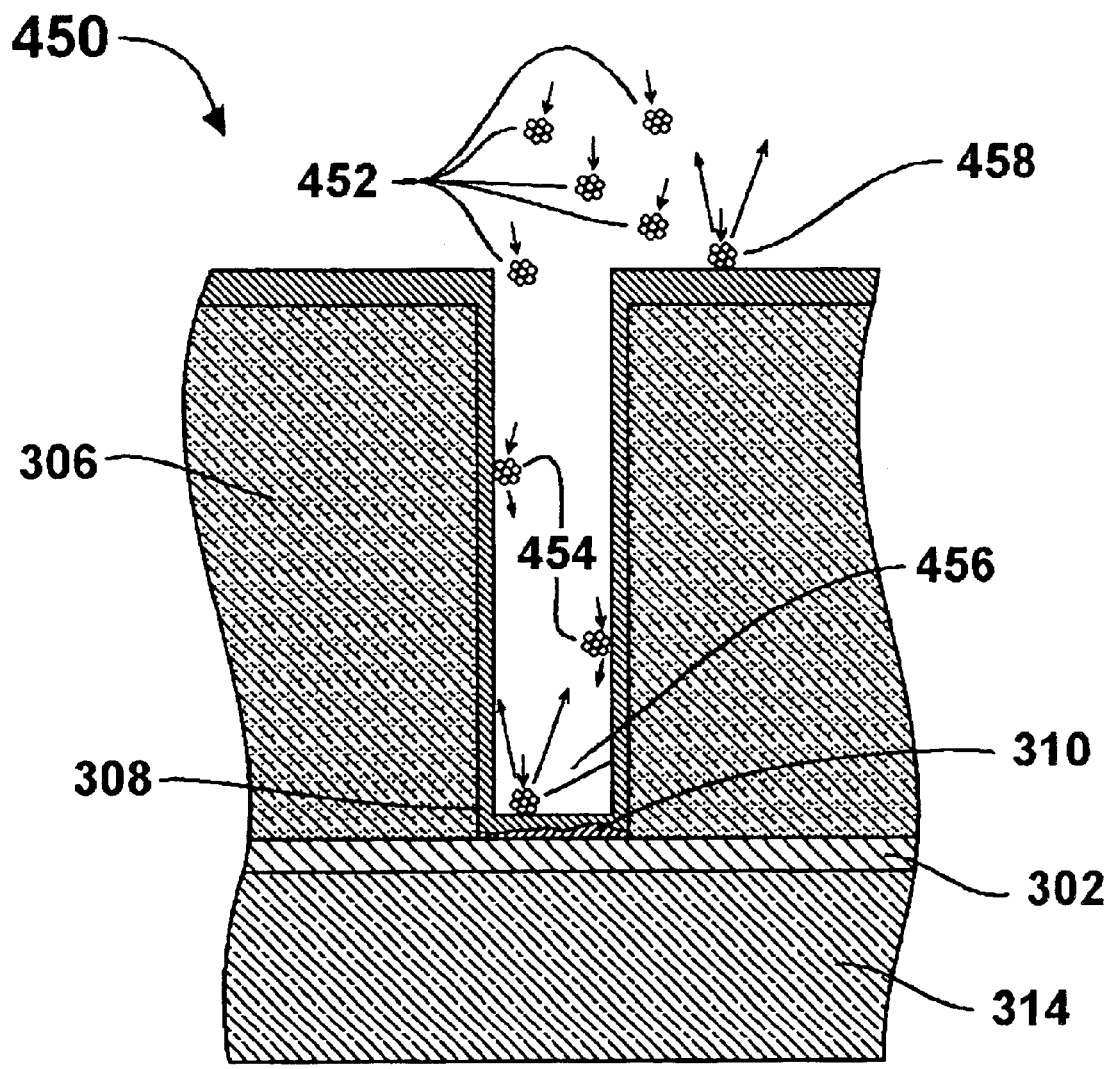
FIG. 5 is a cross section of an electrical interconnect via, illustrating processing of barrier material by GCIB bombardment according to an embodiment of the invention.

FIG. 5 shows a cross section of an electrical interconnect via structure 450, during a stage of fabrication of an integrated circuit that is the same stage as that shown in FIG. 4 (barrier material in place). A gas cluster ion beam 128 approximately parallel with a recess in substrate 306 is used to clean/etch the via base or bottom according to one embodiment of the invention. Incident gas cluster ions 452 have a range of directions deviating slightly from normal to the bottom of the via structure and may be provided by, for example, a mechanically scanning GCIB processing system of the type shown in FIG. 2. Gas cluster ions 454 striking the sidewalls of the via tend to sputter the sidewalls much less effectively than gas cluster ion 456 striking the bottom of the via structure because gas cluster ions sputter most efficiently when their angle of incidence is near-normal to the surface they strike. Accordingly, gas cluster ion processing of via structures is efficient for etching or cleaning the barrier material 308 at the bottom of via structure 450. Ion 458 striking the upper surface of the barrier material 308 also cleans or etches the upper surface much more effectively than the sidewalls of the via structure and somewhat more effectively than the base or bottom of the via structure. This results in thinning, but not necessarily total removal of the upper surface of the barrier material 308, since the upper surface layer of barrier material 308 is typically thicker than the barrier material thickness at the bottom of the via structure.

The process illustrated in FIG. 5 may be used in implementing the substrate embodiment of this invention by starting with a barrier material 308 that is a dielectric or high resistivity material (such as SiC or SiN, for examples, but not for limitation), wherein the result is an electrical interconnection via without a high electrical conductivity barrier material at the bottom interconnect layer 302.

Figure 6:
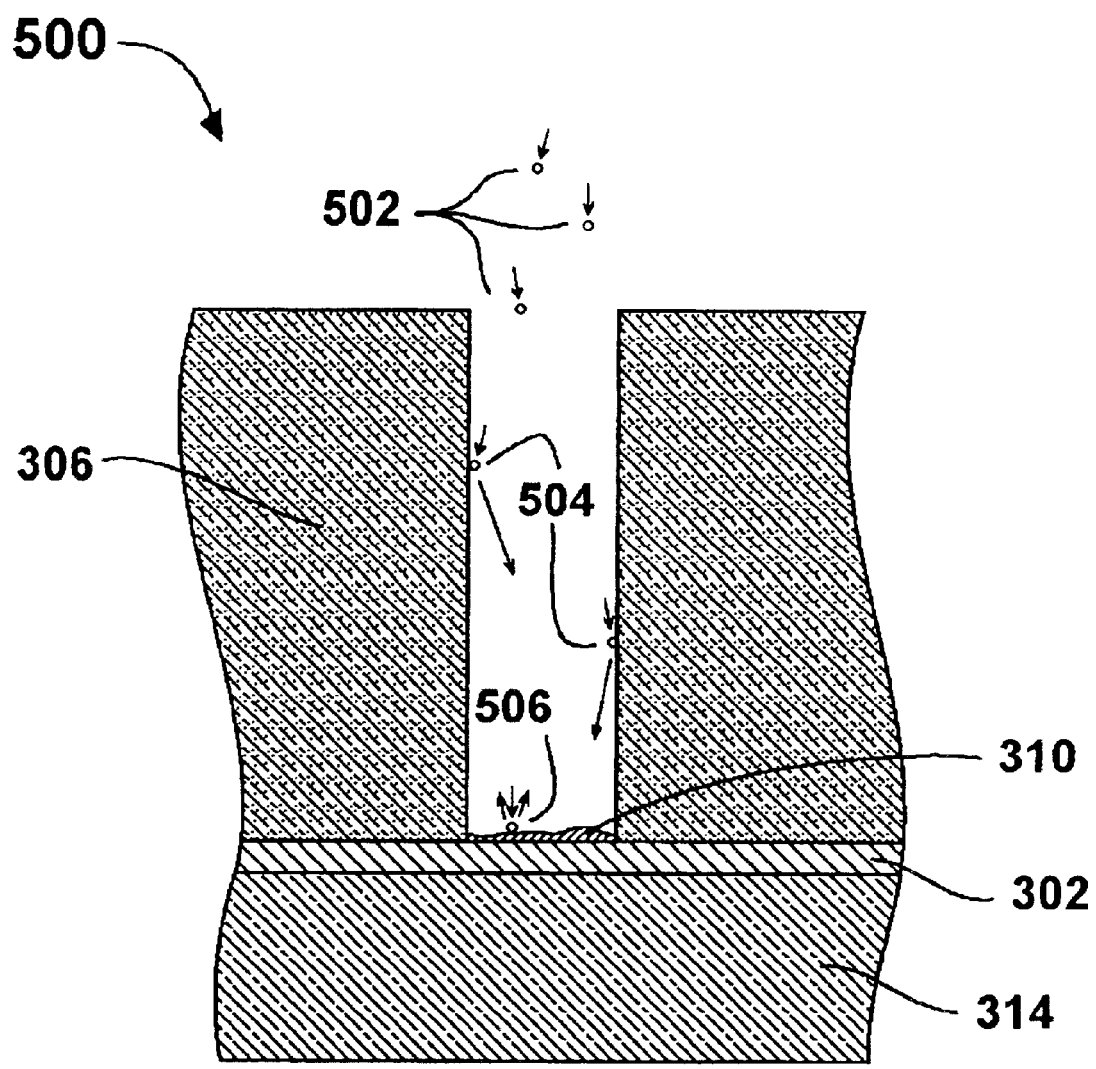
FIG. 6 is a cross section of a prior art electrical interconnect via, illustrating processing of residue by conventional monomer ion bombardment.

FIG. 6 shows a cross section of a prior art electrical interconnect via structure 500, during a stage of fabrication of an integrated circuit earlier than the stage shown in FIG. 4. The interconnect via structure has been etched in the interlayer dielectric 306 but a barrier material has not yet been formed on the interlayer dielectric 306. Conventional prior art monomer ion bombardment to clean/etch the via bottom is illustrated. Incident ions 502 have a range of directions deviating slightly from normal to the bottom of the via structure and may be provided by a directed beam or a plasma etch or reactive ion etch source. Ions 504 striking the sidewalls of the via tend to sputter the sidewalls more effectively than ion 506 striking the bottom of the via structure because conventional monomer ions sputter least efficiently when their angle of incidence is near-normal to the surface they strike. Accordingly, conventional monomer ion processing of via structures is not efficient for etching or cleaning the residue 310 at the bottom of via structure 500.

Figure 7:
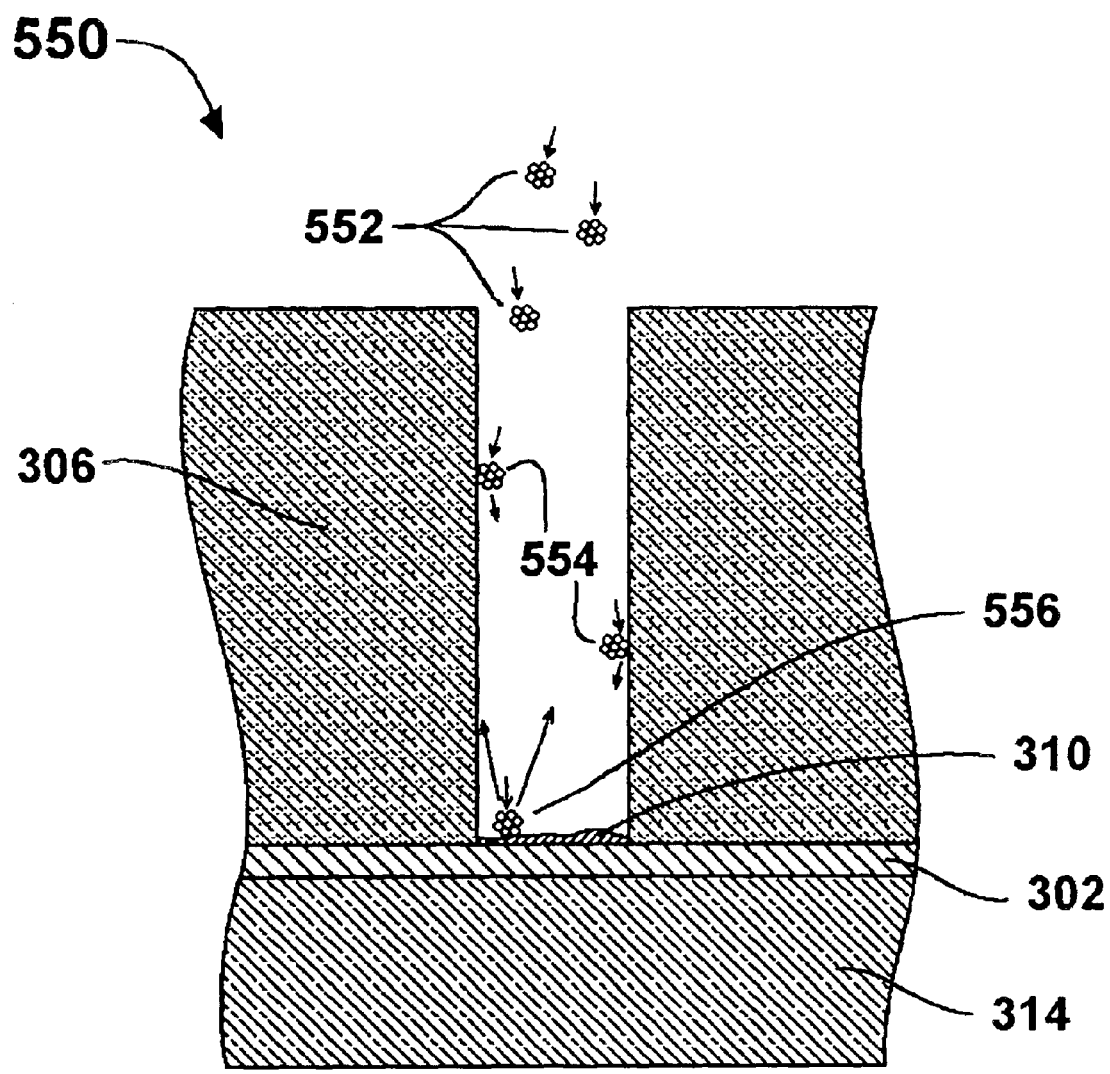
FIG. 7 is a cross section of an electrical interconnect via, illustrating removal of residue by processing with GCIB bombardment according to an embodiment of the invention.

FIG. 7 shows a cross section an electrical interconnect via structure 550, during a stage of fabrication of an integrated circuit that is the same stage as that shown in FIG. 6 (no barrier material in place). A gas cluster ion beam 128, which is approximately parallel with a recess in substrate 306 is used to clean/etch the via base or bottom according to one embodiment of the invention. Incident gas cluster ions 552 have a range of directions deviating slightly from normal to the bottom of the via structure and may be provided by, for example, a mechanically scanning GCIB processing system of the type shown in FIG. 2. Gas cluster ions 554 striking the sidewalls of the via tend to sputter the sidewalls much less effectively than gas cluster ion 556 striking the base or bottom of the via structure because gas cluster ions sputter most efficiently when their angle of incidence is near-normal to the surface they strike. Accordingly, gas cluster ion processing of via structures is efficient for cleaning or removing the residue material 310 at the base or bottom of via structure 550.

Figure 8:
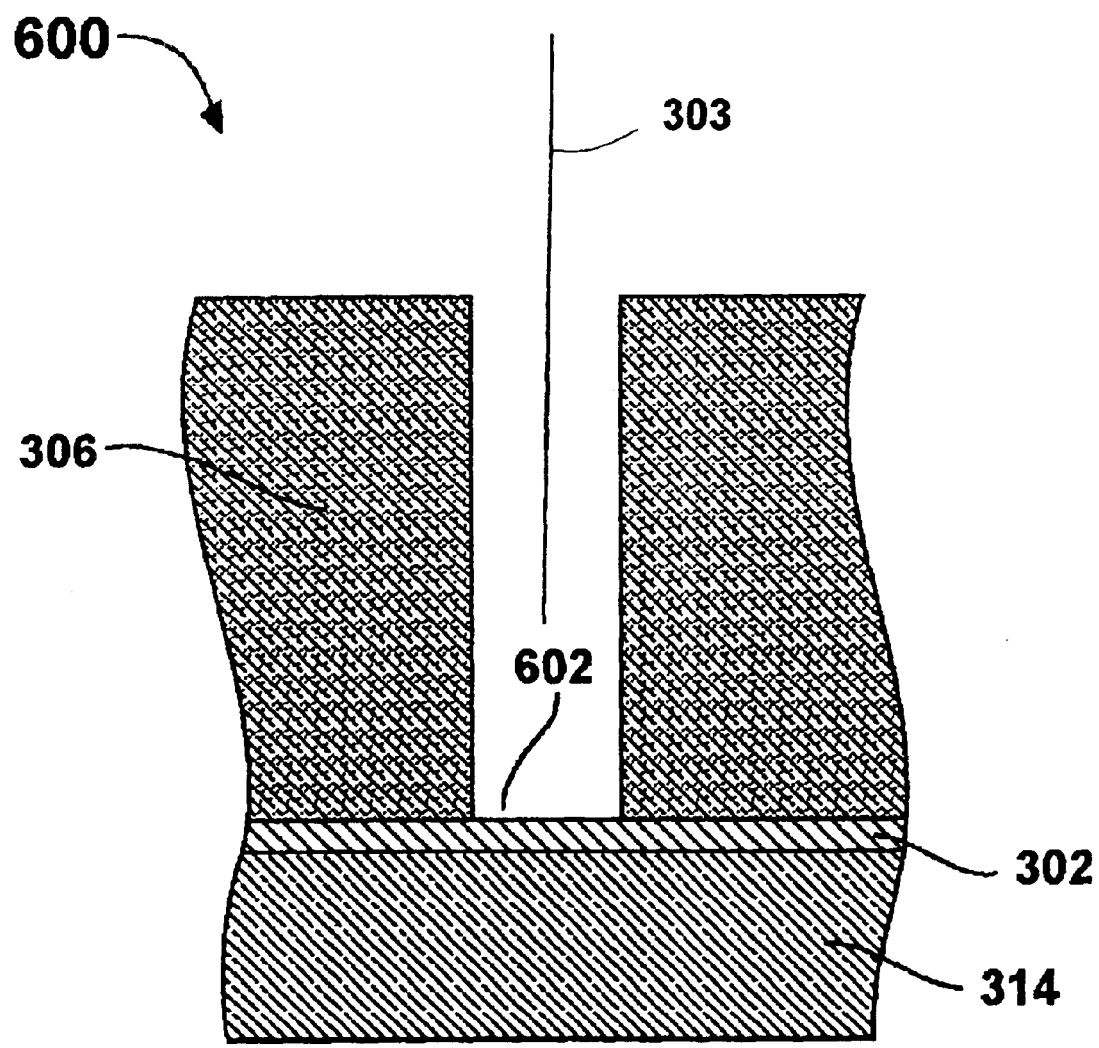
FIG. 8 is a cross section of an electrical interconnect via, free of residue following processing according to an embodiment of the invention.

FIG. 8 shows a cross section of an electrical interconnect via structure 600, resulting from the gas cluster ion beam processing according to one embodiment of the invention as illustrated in FIG. 7. The base or bottom 602 of the interconnect via structure 600 is clean and free of undesirable residues and ready for formation of the barrier material layer.

Figure 9:
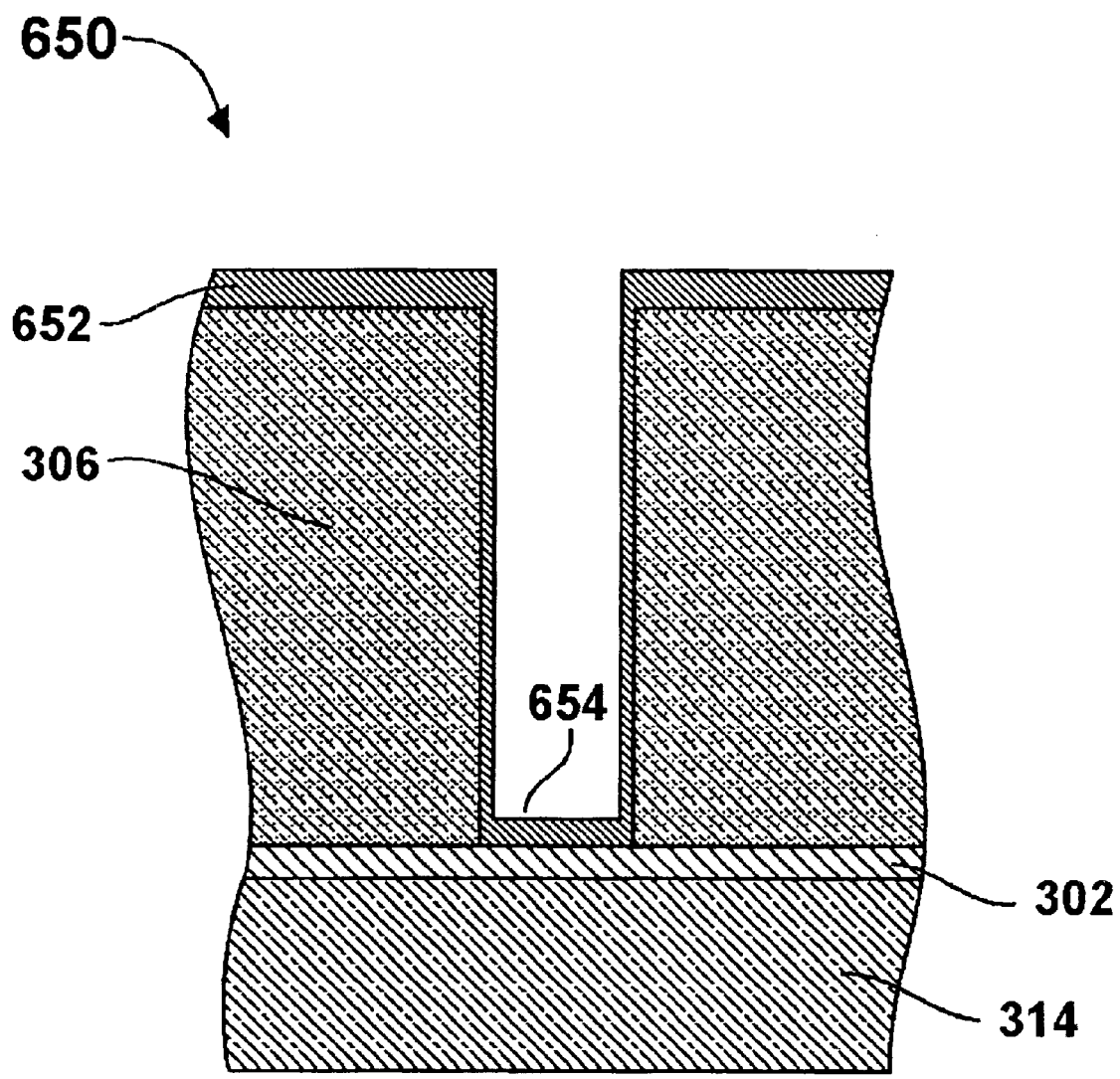
FIG. 9 is a cross section of an electrical interconnect via, showing a barrier material layer that is residue free after formation according to an embodiment of the invention.

FIG. 9 shows a cross section of an electrical interconnect via structure 650, resulting from the gas cluster ion beam processing according to one embodiment of the invention as illustrated in FIG. 7. This is a stage subsequent to that shown in FIG. 8. Barrier material 652 has been formed in the via structure formerly cleaned/etched by the process of the invention. Notice that the base or bottom 654 of the via structure's barrier metal is free of entrapped residues.

Figure 10:
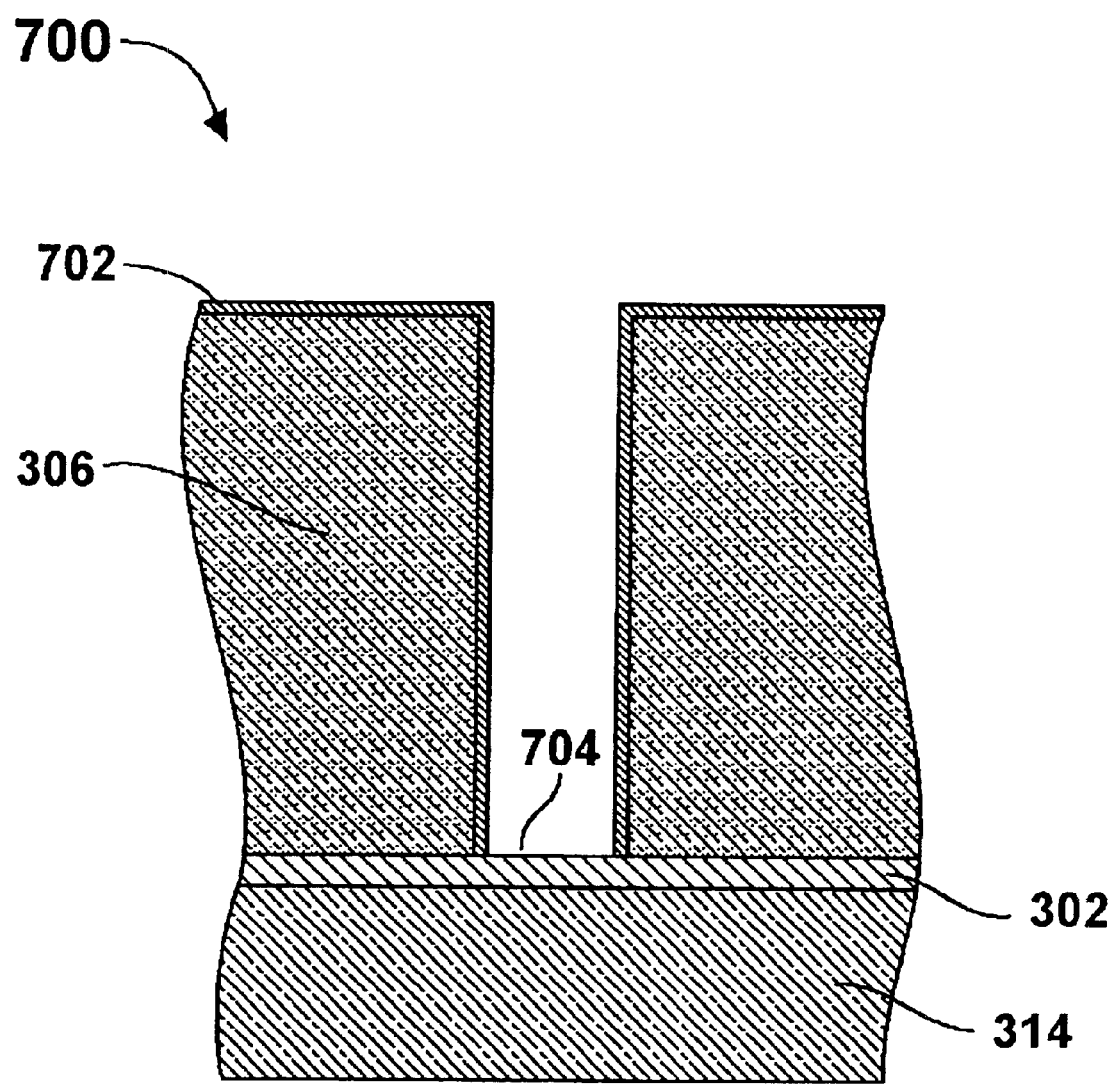
FIG. 10 is a cross section of an electrical interconnect via, without barrier material nor residue at the bottom of the via, according to embodiments of the invention.

FIG. 10 shows a cross section an electrical interconnect via structure 700, resulting from the gas cluster ion beam processing according to one embodiment of the invention as illustrated in FIG. 5. The base or bottom 704 of the interconnect via structure 700 is free of barrier material and undesirable residues and ready for formation of the metal plug. Note that the original barrier material 308 (shown in FIG. 5) has been etched and cleaned by the processing of the method of the invention and the remaining upper surface barrier material 702 has been thinned. Since the barrier material has been completely removed from the base or bottom 704 of the via structure, this invention provides an electrical via structure wherein the barrier material is a dielectric or high resistivity material (such as SiC or SiN, for example) due to the fact that the barrier material is not a part of the electrical connectivity circuit of the interconnect via structure.

Figure 11:
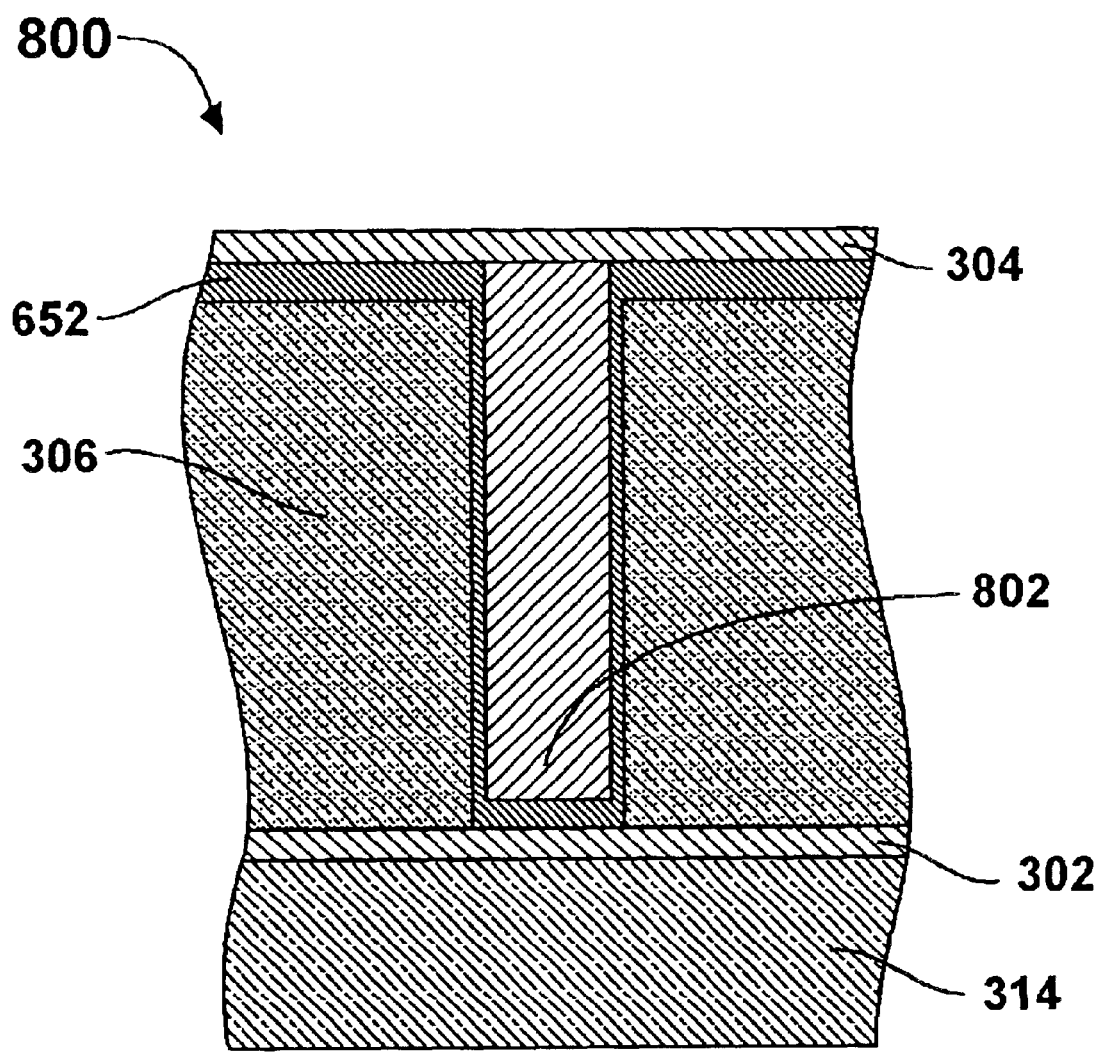
FIG. 11 is a cross section of an improved complete electrical interconnect via, including plug metal, between two metal interconnect layers, with a residue-free barrier material at the bottom of the via, according to an embodiment of the invention.

FIG. 11 is a cross section of an improved complete electrical interconnect via structure 800, including plug metal 802, between two metal interconnect layers, with a residue-free barrier material at the base or bottom of the via, according to one embodiment of the invention. The barrier material 652 between the plug metal 802 and the lower interconnect metal 302 layer is residue free, thus providing a lower resistance interconnect.

Figure 12:
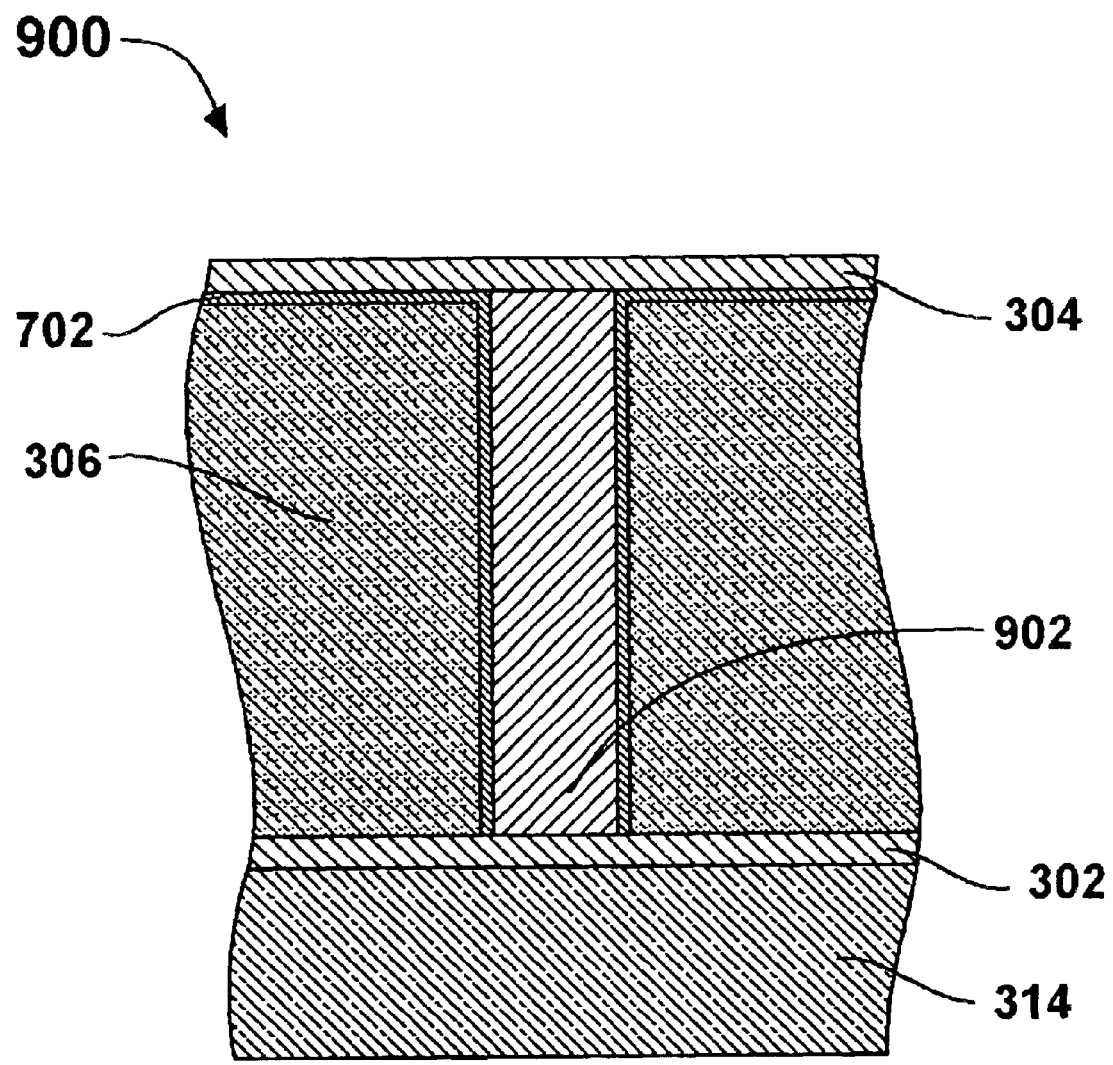
FIG. 12 is a cross section of an improved complete electrical interconnect via, including plug metal, between two metal interconnect layers, with no barrier material or residue at the bottom of the via, according to embodiments of the invention.

FIG. 12 is a cross section of an improved complete electrical interconnect via structure 900, including plug metal 902, between two metal interconnect layers, with no barrier material or residue at the bottom of the via, according to one embodiment of the invention. FIG. 12 also illustrates the substrate embodiment of the invention when the barrier material 702 is a dielectric or high resistivity material such as SiN, SiC, or the like. A typical such structure of approximately 100 to 200 nm via diameter, wherein the dielectric barrier layer and residue has been removed from the bottom of the via may readily exhibit an interconnect resistance of less than 20 ohms (or even a few ohms), while a corresponding structure wherein the dielectric barrier layer and residue has not been removed from the bottom of the via exhibits a resistance of more than a thousand ohms.

Figure 13:
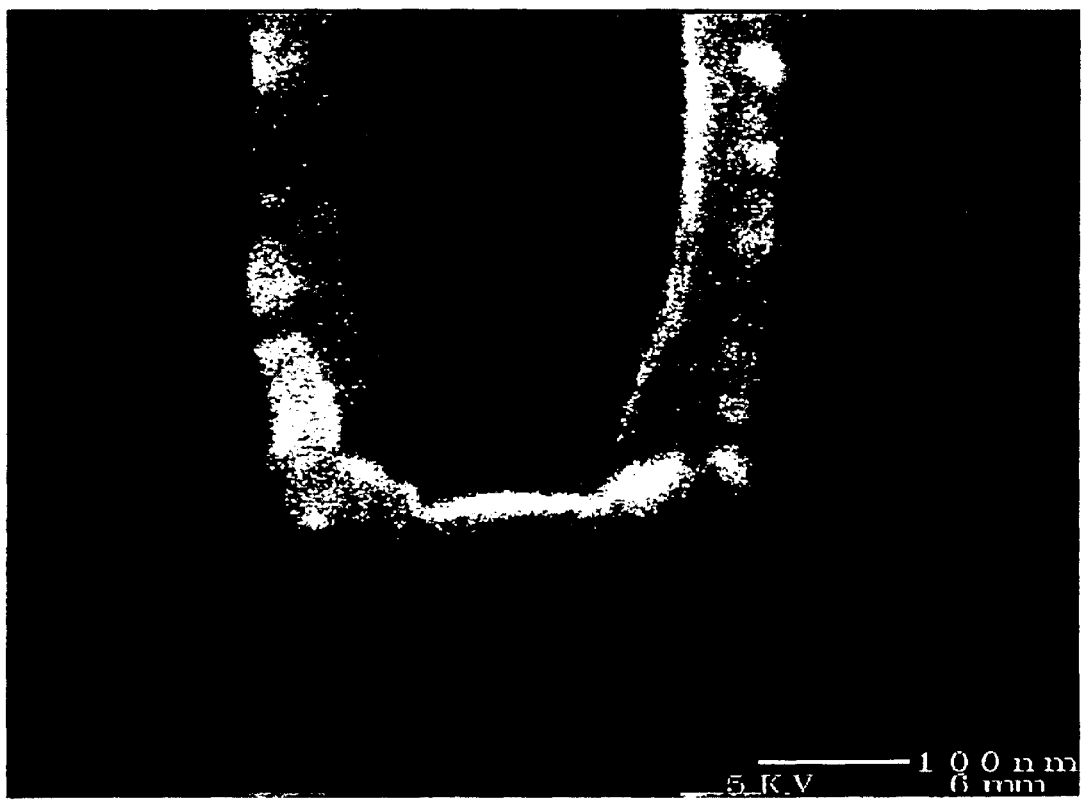
FIG. 13 is a scanning electron micrograph of a cross sectional view of the bottom of a prior art electrical interconnect via, with barrier material on the sidewalls and at the bottom.

FIG. 13 is a scanning electron micrograph of a cross sectional view of the bottom of a prior art electrical interconnect via, with barrier material on the sidewalls and at the bottom.

Figure 14:
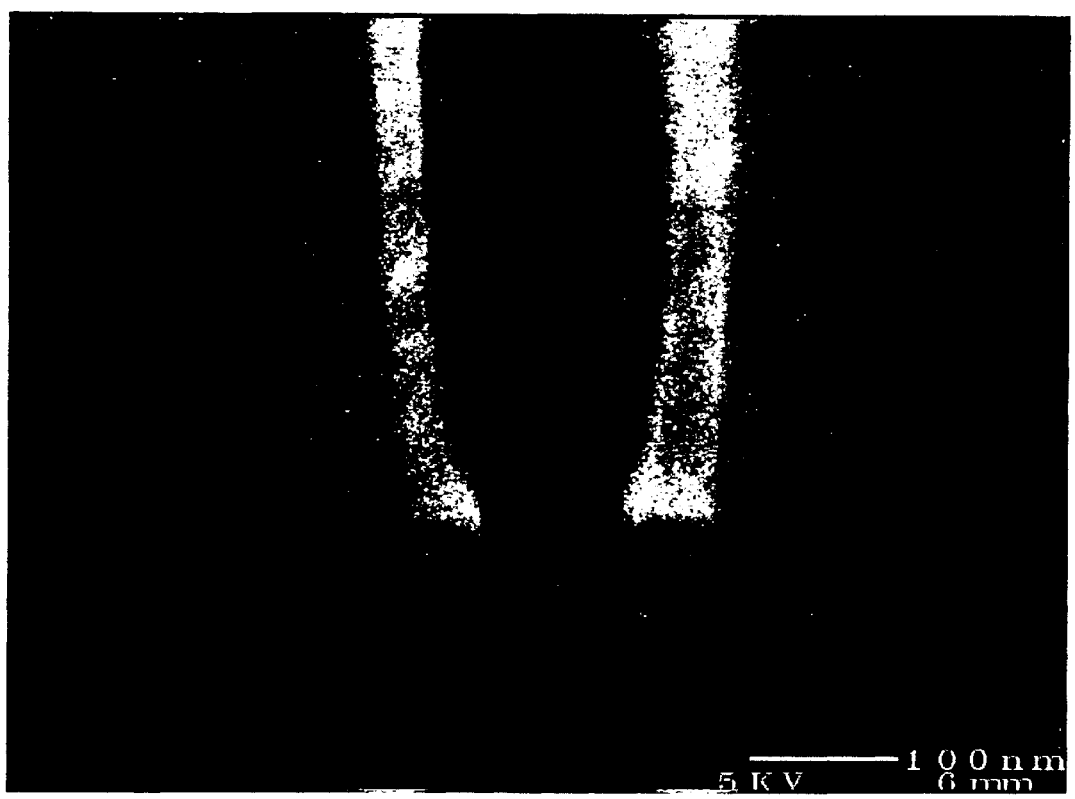
FIG. 14 is a scanning electron micrograph of a cross sectional view of the bottom of an electrical interconnect via, after processing according to the invention, showing removal of barrier material at the bottom of the via, but leaving the sidewall barrier material intact.

FIG. 14 is a scanning electron micrograph of a cross sectional view of the bottom of an electrical interconnect via, corresponding to the stage schematically shown in FIG. 10 (after processing according to the invention), showing removal of barrier material at the base or bottom of the via, but leaving the sidewall barrier material intact.

Although the invention has been described with respect to various embodiments, it should be realized this invention is also capable of a wide variety of further and other embodiments within the spirit of the invention and scope of the appended claims. For example, lower mass gas cluster ions, ranging in size from 1 to 10 molecules, may be readily removed from the GCIB 128 by the use of a magnetic field as described in copending U.S. patent application Ser. No. 09/727,810, filed Dec. 1, 2000, and published on Oct. 25, 2001 with publication number 20010033128 A1.

What is claimed is:

1. A method for processing a trench or via, which extends into a substrate to a base or bottom, wherein said trench or via is coated with a barrier material on a sidewall and on said base or bottom, comprising the step of directing a gas cluster ion beam through said recess directly on to said base or bottom so as to etch said barrier material from said base or bottom without substantially etching said barrier material from said sidewall of said trench or via.

2. The method of claim 1, wherein said trench or via is an opening in an inter-metal dielectric material, and further wherein said barrier material is a highly resistive, diffusion barrier layer.

3. The method of claim 1, wherein said directing step additionally remove residue material from said base or bottom after formation of said trench or via in said substrate.

4. The method of claim 1, wherein said trench or via extends into said substrate in one or more directions to said base or bottom, and further wherein said step of directing is performed approximately parallel to said one or more directions.

5. The method of claim 4, wherein said gas cluster ion beam is directed approximately parallel to said one or more directions that said trench or via extends into said substrate.

6. The method of claim 1, wherein the gas cluster ion beam clusters comprise an inert gas and a reactive gas.

7. The method of claim 6, wherein the reactive gas comprises a halogen or halogen-bearing gas.

8. The method of claim 1, wherein said step of directing is performed in an atmospheric pressure of less than $10^{-4}$ Torr.

9. A method of processing a via, which extends into a substrate to a base or bottom, said via being substantially cylindrical and having a central axis, comprising the steps of:
   directing a gas cluster ion beam through said via onto said base or bottom; and
   maintaining said gas cluster ion beam approximately parallel to said central axis.

10. A method of processing a trench, which extends into a substrate to a base or bottom, said trench extending into said substrate and having an imaginary median surface defining the approximate center of said trench, comprising the steps of:
    directing a gas cluster ion beam through said via onto said base or bottom; and
    maintaining said gas cluster ion beam approximately parallel to said median surface.

11. A method for processing a recess, such as a trench or via, which extends into a substrate to a base or bottom, comprising the steps of:
    directing a gas cluster ion beam through said recess directly on to said base or bottom; and
    moving said substrate with respect to said gas cluster ion beam while substantially maintaining fixed angle of incidence between said gas cluster ion beam and said substrate.

12. The method of claim 11, wherein said step of moving includes moving said gas cluster ion beam relative to said substrate while maintaining said substrate substantially normal to said gas cluster ion beam.

13. A method for processing a recess, such as a trench or via, which extends into a substrate to a base or bottom, comprising the step of directing a gas cluster ion beam through said recess directly on to said base or bottom, wherein the gas cluster ion beam clusters comprise an inert gas and a reactive gas, and at least one of hydrogen or oxygen.

14. A method for removing diffusion barrier layer material from a bottom of a trench or via structure during fabrication of an integrated circuit, comprising:

a. providing an integrated circuit substrate for forming an integrated circuit, said substrate containing at least one trench or via structure at a surface of said subtrate, said at least one trench or via structure having a bottom comprising diffusion barrier layer material and at least one sidewall comprising a diffusion barrier layer material;

b. forming an accelerated and directed gas cluster ion beam in a reduced pressure chamber, said gas cluster ion beam having a beam path;

c. disposing said surface of said substrate in the reduced pressure chamber and in the gas cluster ion beam path; and d. irradiating the bottom of the at least one trench or via structure with the gas cluster ion beam to remove diffusion barrier layer material from the bottom of the at least one trench or via structure.

15. The method of claim 14, wherein the diffusion barrier layer material comprises at least one of the group (Ta, TaN, TiSiNx, SiC, and SiN).

16. The method of claim 14, wherein the diffusion barrier layer material is a dielectric material.

17. The method of claim 14, wherein the diffusion barrier layer material comprises a material having an undesirably high electrical resistivity material.

18. The method of claim 14, wherein the trench or via is an opening in an inter-metal dielectric material.

19. The method of claim 14, wherein the trench or via is a portion of an electrical interconnect system in a dual damascene integrated circuit process.

20. The method of claim 14, wherein said via is substantially cylindrical and has a central axis, and further wherein said gas cluster ion beam is maintained approximately parallel to said central axis.

21. The method of claim 14, wherein said trench has an imaginary median surface, and further wherein said gas cluster ion beam is maintained approximately parallel to said median surface.

22. The method of claim 14, wherein the gas cluster ion beam clusters comprise an inert gas and a reactive gas.

23. The method of claim 22, wherein the reactive gas comprises a halogen or halogen-bearing gas.

24. The method of claim 14, wherein the gas cluster ion beam clusters comprise an inert gas and a reactive gas and at least one of hydrogen or oxygen.

25. The method of claim 14, wherein the reactive gas comprises a halogen or halogen bearing gas.

26. The method of claim 14, wherein the diffusion barrier layer material on the at least one sidewall is not removed.

27. The method of claim 14, wherein the diffusion barrier layer material on the at least one sidewall is not removed.

28. A method for processing a base or bottom of a trench or via in a substrate, comprising the step of directing a gas cluster ion beam through said trench or via directly onto said base or bottom so as to etch a contaminating residue material from said base or bottom.

29. The method of claim 28, wherein said trench or via is an opening in an inter-metal dielectric material, and further wherein said barrier material is a highly resistive diffusion barrier layer.

30. The method of claim 28, wherein said trench or via is coated with a barrier material on a sidewall and on said base or bottom.

31. The method of claim 30, wherein said directing step further etches said barrier material from said base or bottom.

* * * * *